(12) United States Patent
Wilhelmsson et al.

(10) Patent No.: US 6,883,130 B2
(45) Date of Patent: Apr. 19, 2005

(54) ENHANCED AND ADAPTIVE ERROR DETECTION IN DIGITAL COMMUNICATIONS

(75) Inventors: Leif Wilhelmsson, Dalby (SE); Jan Åberg, Lund (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 542 days.

(21) Appl. No.: 09/963,652

(22) Filed: Sep. 27, 2001

(65) Prior Publication Data

US 2002/0178419 A1 Nov. 28, 2002

Related U.S. Application Data

(60) Provisional application No. 60/292,930, filed on May 24, 2001.

(51) Int. Cl.[7] .................................................. H04L 1/08
(52) U.S. Cl. ........................................ 714/748; 714/749
(58) Field of Search .............................. 714/748, 749, 714/755, 758, 774, 807

(56) References Cited

U.S. PATENT DOCUMENTS

| | | | | |
|---|---|---|---|---|
| 4,654,853 A | * | 3/1987 | Moriyama et al. | 714/774 |
| 5,444,719 A | * | 8/1995 | Cox et al. | 714/769 |
| 5,539,755 A | * | 7/1996 | Baggen | 714/779 |
| 5,600,663 A | | 2/1997 | Ayanoglu et al. | |
| 5,719,883 A | | 2/1998 | Ayanoglu | |
| 5,867,510 A | | 2/1999 | Steele | |
| 6,044,485 A | | 3/2000 | Dent et al. | |
| 6,128,763 A | | 10/2000 | LoGalbo et al. | |
| 6,141,788 A | | 10/2000 | Rosenberg et al. | |
| 6,145,109 A | | 11/2000 | Schuster et al. | |
| 6,208,663 B1 | | 3/2001 | Schramm et al. | |
| 6,282,691 B1 | * | 8/2001 | Sakata | 714/807 |
| 6,405,340 B1 | * | 6/2002 | Irvin et al. | 714/774 |
| 6,625,775 B1 | * | 9/2003 | Kim | 714/755 |

FOREIGN PATENT DOCUMENTS

| | | |
|---|---|---|
| EP | 0797327 A2 | 9/1997 |
| GB | 2160392 A | 12/1985 |

OTHER PUBLICATIONS

Mazo et al, "Error–Burst Detection with Tandem CRC's", IEEE Transactions on Communications, vol. 39, No. 8, Aug. 1991, pp. 1175–1178.*

J.C. Haartsen, "The Bluetooth Radio System," IEEE Personal Communications, vol. 7, No. 1, Feb. 2000, pp. 28–36.

Dimitri Bertsekas and Robert Gallager, "Data Networks," Second Edition, Prentice–Hall International, Inc., 1992, pp. 60–65.

John G. Proakis, "Digital Communications," Fourth Edition, McGraw Hill, 2000, pp. 470–485.

\* cited by examiner

*Primary Examiner*—Stephen M. Baker
(74) *Attorney, Agent, or Firm*—Potomac Patent Group, PLLC

(57) ABSTRACT

A codeword is generated for transmission in a communications system by generating a first error detection code from information bits, and generating a second error detection code from the information bits and the first error detection code. The information bits, the first error detection code and the second error detection code are then concatenated. The codeword is received by using the first error detection code to make a first determination whether the information bits are error-free, and using the second error detection code to make a second determination whether the information bits and the first error detection code are error-free. The information bits are accepted only if the first determination indicates that the information bits are error-free and the second determination indicates that the information bits and the first error detection code are error-free. The technique is extendable to include additional error detection codes.

24 Claims, 5 Drawing Sheets

ENHANCED AND ADAPTIVE ERROR DETECTION IN DIGITAL COMMUNICATIONS

CROSS REFERENCE TO RELATED APPLICATIONS

This application claims the benefit of U.S. Provisional Application No. 60/292,930, filed May 24, 2001, which is hereby incorporated herein by reference in its entirety.

BACKGROUND

The present invention relates to digital communication techniques, more particularly to error detection coding of blocks of information in digital form, and still more particularly to techniques for providing higher levels of error detection coding in ways that are backwards compatible with techniques that provide lower levels of error detection coding.

In wireless and other communication systems, the data to be communicated is typically transmitted in bursts. This is, for example, the case for cellular systems built in accordance with either of the well-known GSM or IS-95 standards. This is also the case for systems that permit ad-hoc piconets to be established, such as those systems operating in accordance with BLUETOOTH™ technology, which operates in the unlicensed Industrial, Scientific and Medical (ISM) radio frequency band at 2.4 GHz. See, for example, J. C. Haartsen, "The Bluetooth radio system," *IEEE Personal Communications*, vol. 7, No. 1, February 2000.

For all of these kinds of systems, coding is used to enhance the quality of the link. The general principles of such coding are well known, and are described in, for example, D. Bertsekas and R. Gallager, *Data Networks*, 2nd edition, Prentice-Hall, 1992. One can distinguish between two different kinds of coding, namely coding used for error correction and coding used for error detection. Often both of these types of coding are employed to optimize the performance of the system. FIG. 1 is a block diagram that illustrates a typical communications system in which both error detection and error correction coding are employed. First, on the transmitter side, the information bits to be sent are encoded for error detection 101. This step is typically achieved by adding so-called cyclic redundancy check (CRC) bits, although other types of error detection codes (e.g., parity bits) may alternatively be used. Then, the information bits and the CRC bits are encoded in a way that provides forward error correction (FEC) capability 103. The resultant bits are then transmitted over the channel 105.

On the receiver side of the system, the process is the reverse. First, the received bits are subjected to error correction decoding 107. This step attempts to correct bit errors that appeared in the received group of bits. Ideally, the error correction code is able to correct most of the errors in the received blocks, and in this case the use of the FEC code permits the number of retransmissions to be reduced significantly. However, the FEC code is not always capable of correcting all of the errors in the received blocks, so before the decoded codeword is accepted as correct, it is checked by means of the error detection processing 109 (e.g., a CRC decoder). This helps ensure that the decoded codeword does not contain any uncorrectable errors. In this way, the probability of accepting an erroneous decoded codeword can ideally be made sufficiently small.

A characteristic property of ad-hoc networks, such as those utilizing BLUETOOTH™ technology, is that interference is not under control. In fact, since an interfering device may very well be much closer to the receiver than the intended transmitter is, the signal-to-interference ratio (SIR) can be extremely small, for example −20 dB. Also, for systems operating in an unlicenced band such as the 2.4 GHz ISM band, the interferer can be a device with a significantly higher output power, such as a microwave oven. In such cases, the received SIR can be more than, for example, 20 dB from where the system is working properly.

For the small fraction of packets in an ad hoc system that are hit by interference, the error correcting code is virtually worthless. This, of course, means that the packet will not be correctly decoded. However, what is even worse is that unless the code used for error detection is powerful enough, the erroneous decoded packet might not be detected as erroneous but might instead be accepted as correct.

The simple explanation for this malfunction is that for relatively good channel conditions, the probability of falsely accepting a packet is very small due to the combined use of an error correcting code and an error detecting code. However, if the channel conditions become very poor, the probability of falsely accepting a packet will be determined by the properties of the error detecting code alone.

When a system is initially designed, it can be hard to determine how powerful the error detection coding needs to be. The reason for this is twofold. First, it can be difficult to determine what the channel conditions will be like. Second, it is almost impossible to know beforehand what kind of applications will be supported, and what kind of requirements these applications will place on the system. In any of these cases, it might be desirable to be able to enhance the error detecting capability after the system has been initially designed and put into practice. Making a change to enhance the error correcting/detecting capability of an existing system presents problems however, because existing receivers will typically be unable to accommodate a change in the format of the received information.

It is therefore desirable to provide methods and apparatuses to permit enhancement of error detecting capability in an already designed system. It is also desirable to allow for an application-dependent adaptive change in a system's error detection capability.

SUMMARY

It should be emphasized that the terms "comprises" and "comprising", when used in this specification, are taken to specify the presence of stated features, integers, steps or components; but the use of these terms does not preclude the presence or addition of one or more other features, integers, steps, components or groups thereof.

In accordance with one aspect of the present invention, the foregoing and other objects are achieved in methods and apparatuses that generate a codeword for transmission in a communications system. Generation of the codeword includes generating a first set of error detection check bits from one or more information bits, and generating a second set of error detection check bits from the one or more information bits and the first set of error detection check bits. The one or more information bits, the first set of error detection check bits and the second set of error detection check bits are then concatenated.

In other embodiments, additional error detection capability can be provided by similarly generating and concatenating additional (e.g., a third, fourth, . . . ) sets of error detection check bits, based on the information bits and the previously generated sets of error detection check bits.

In another aspect, receipt of such a codeword comprises using the first set of error detection check bits to make a first determination whether the one or more information bits are error-free, and using the second set of error detection check bits to make a second determination whether the one or more information bits and the first set of error detection check bits are error-free. The one or more information bits are accepted only if the first determination indicates that the one or more information bits are error-free and the second determination indicates that the one or more information bits and the first set of error detection check bits are error-free.

In some embodiments, the performance of both determinations is optional. That is, in such embodiments it is determined whether a first level of error detection or a second level of error detection is to be used. If the second level of error detection is desired, then the one or more information bits are accepted only if the first and second determinations both indicate receipt of an error-free codeword. However, if the first level of error detection is to be used, then it is sufficient for accepting the one or more information bits that the first determination indicates that the one or more information bits are error-free.

In alternative embodiments, the techniques for receiving the codeword are extendable to include higher levels of error detection capability by means of additional (e.g., third, fourth, . . . ) sets of error detection check bits that were generated based on the one or more information bits and the previously generated sets of error detection check bits. Additional error detection steps are then added, one for each additional set of error detection check bits that is to be utilized.

In another aspect, where the receiver determines a level of error detection capability that is to be used, such determination can be based on information included in the received codeword or in an indication associated with the received codeword, such as an indication of how many sets of error detection check bits are included in the codeword. Alternatively, the determination can be based on dynamically changing error detection requirements, such as whether the received codeword is a retransmitted codeword, or how many times a received codeword has been retransmitted.

BRIEF DESCRIPTION OF THE DRAWINGS

The objects and advantages of the invention will be understood by reading the following detailed description in conjunction with the drawings in which.

DETAILED DESCRIPTION

Figure 1:
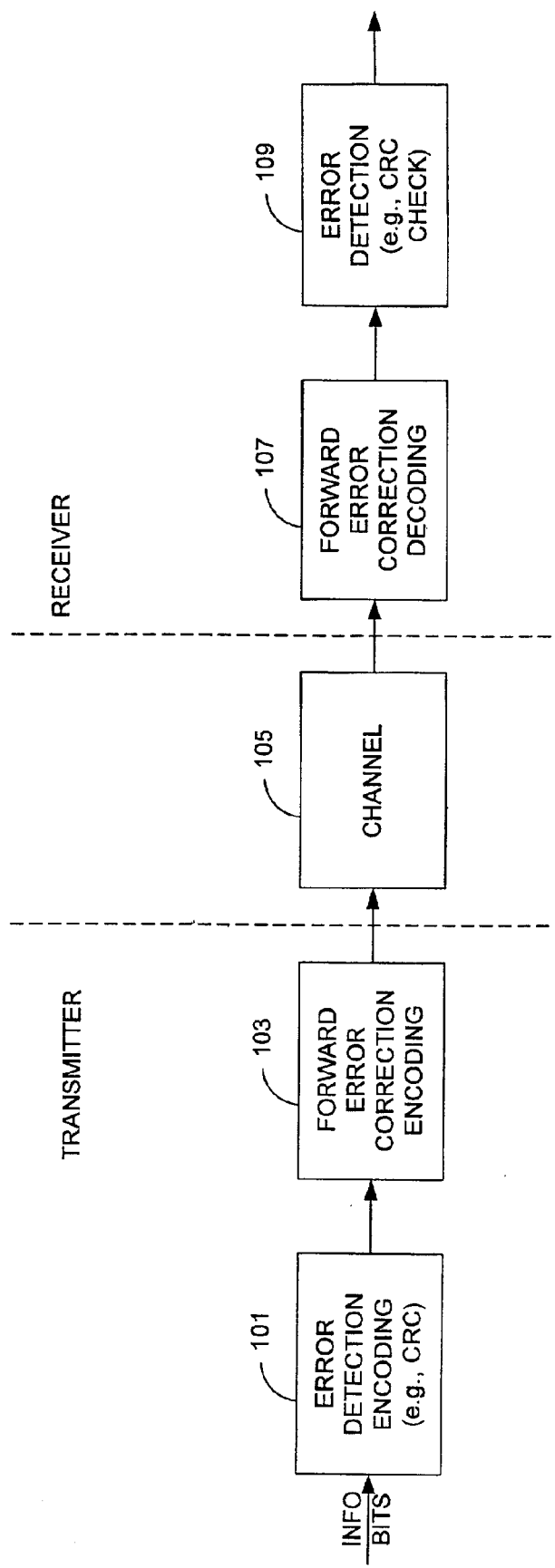
FIG. 1 is a block diagram that illustrates a typical communications system in which both error detection and error correction coding are employed.

The various features of the invention will now be described with reference to the figures, in which like parts are identified with the same reference characters.

The various methods and apparatuses described herein make it possible to decrease the probability of accepting erroneous codewords in a simple way. The techniques employed in the various embodiments also make possible an application-dependent adaptation of the error detection capability.

The various embodiments rely on the concatenation of two or more sets of error detection check bits. A first set of error detection check bits is generated based only on the information bits to be transmitted. A second set of error detection check bits is then generated based both the information bits and the first set of error detection check bits. In some embodiments, additional sets of error detection check bits may also be generated, each one based on the information bits and all earlier-generated sets of error detection check bits. The information bits and all generated sets of error detection check bits are then concatenated and transmitted. At the receive side, the receiver may use as many of the sets of error detection check bits as desired, and ignore the others. In this respect, the methods and apparatuses are also backward compatible with existing systems.

The various aspects of the invention will now be described in greater detail in connection with a number of exemplary embodiments. To facilitate an understanding of the invention, many aspects of the invention are described in terms of sequences of actions to be performed by elements of a computer system. It will be recognized that in each of the embodiments, the various actions could be performed by specialized circuits (e.g., discrete logic gates interconnected to perform a specialized function), by program instructions being executed by one or more processors, or by a combination of both. Moreover, the invention can additionally be considered to be embodied entirely within any form of computer readable carrier, such as solid-state memory, magnetic disk, optical disk or carrier wave (such as radio frequency, audio frequency or optical frequency carrier waves) containing an appropriate set of computer instructions that would cause a processor to carry out the techniques described herein. Thus, the various aspects of the invention may be embodied in many different forms, and all such forms are contemplated to be within the scope of the invention. For each of the various aspects and elements of the invention, any such form of embodiment may be referred to herein as "logic configured to" perform a described action, or alternatively as "logic that" performs a described action.

To facilitate an understanding of the invention, the following descriptions focus on the error detection codes without illustrating any FEC codes that may also be employed. It will be understood, however, that the invention may be practiced with or without the additional use of FEC codes. For more information on FEC codes, the reader is referred to John G. Proakis, *Digital Communications*, 4th ed." (McGraw Hill, 2000, ISBN: 0-07-232111-3).

Figure 2:
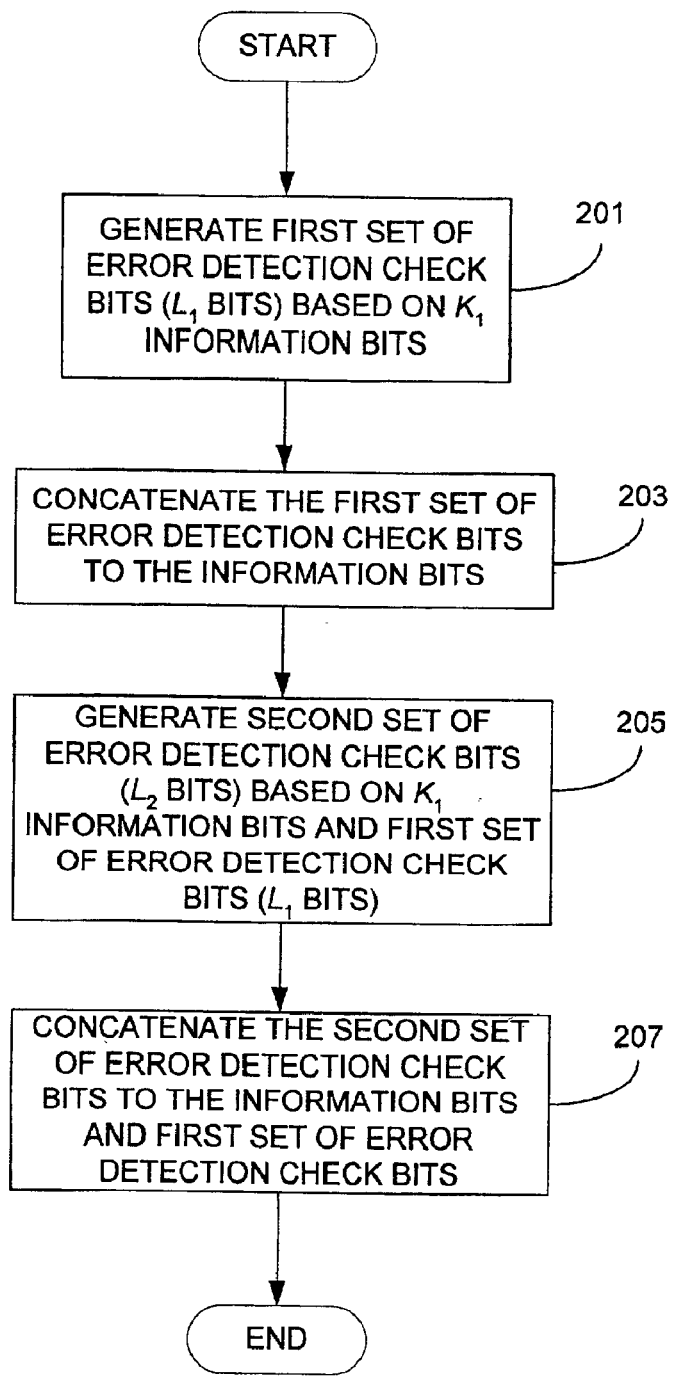
FIG. 2 is a flowchart showing steps performed for generating a codeword in accordance with one embodiment of the invention
Figure 3A:
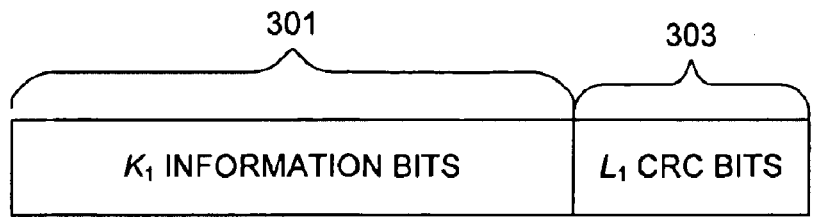
FIGS. 3A–3D are block diagrams illustrating codewords generated in accordance with an embodiment of the invention.
Figure 3B:
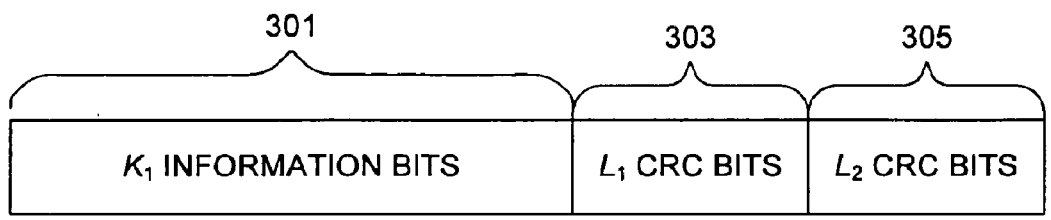

A first embodiment of the invention will now be described with reference to the flowchart of FIG. 2 and the block diagrams of FIGS. 3A and 3B. Initially, a number, $K_1$, of information bits 301 are encoded for error detection. This is done by generating a first set of error detection check bits 303 in the form of a number, for example $L_1$, of error detection bits (e.g., CRC bits) based on (i.e., as a function of) the information bits 301 (step 201). The first set of error detection check bits 303 is then concatenated with the information bits 301 (step 203) so that the total number of bits is now $N_1$ (i.e., $N_1=K_1+L_1$). The result of this step is illustrated in FIG. 3A.

Next, the $N_1$ bits are encoded for error detection by generating a second set of error detection check bits 305 in the form of a number, for example $L_2$, of error detection bits (e.g., CRC bits) based on the information bits 301 and the first set of error detection check bits 303 (step 205). The second set of error detection check bits 305 is then concatenated with the information bits 301 and the first set of error detection check bits 303 (step 207), so that the total number of bits is now $N_2$ (i.e., $N_2=N_1+L_2$). The result of this step is illustrated in FIG. 3B.

Figure 4:
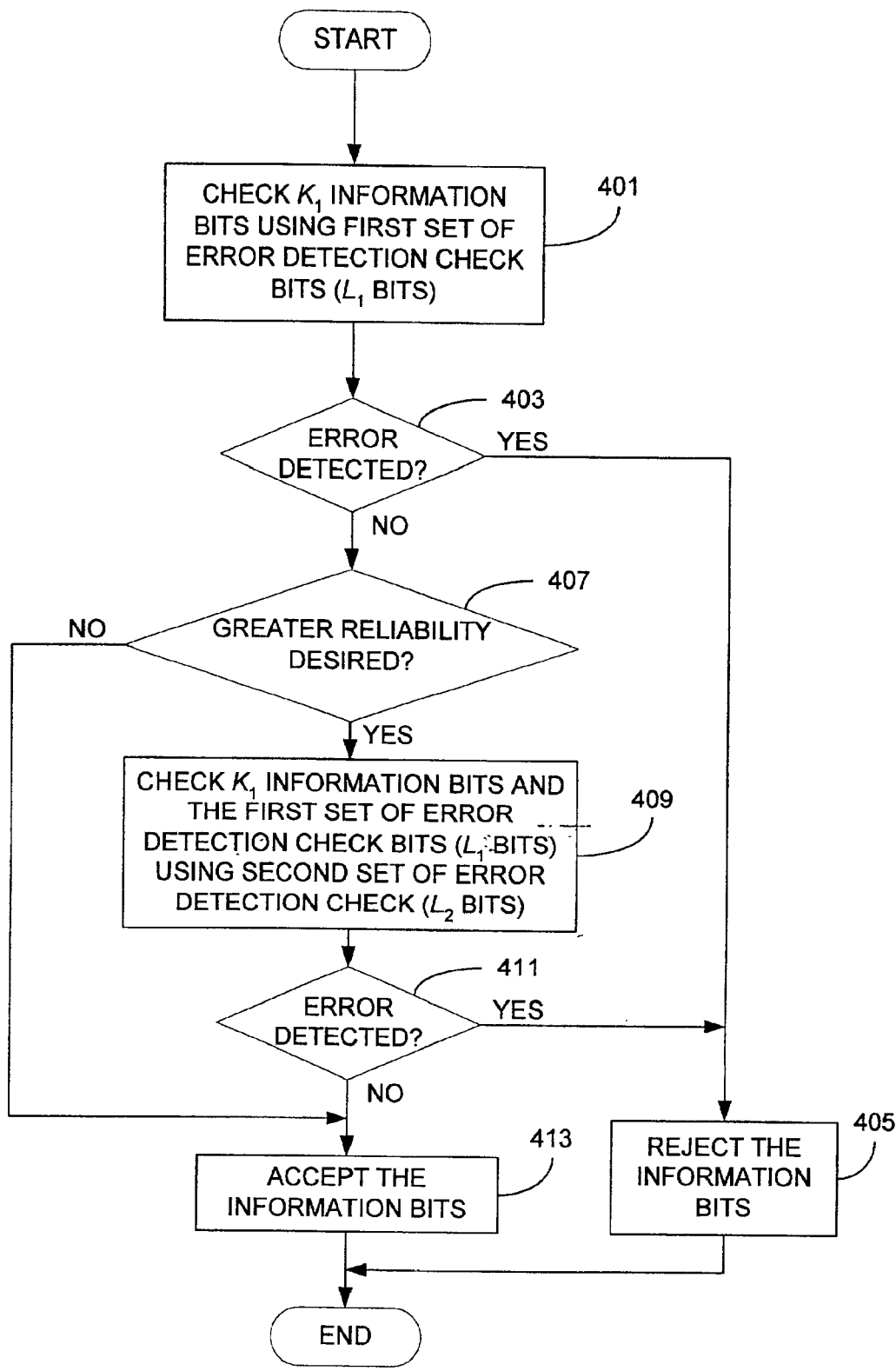
FIG. 4 is a flowchart illustrating steps performed in accordance with another aspect of the invention in which, in the receiver, the level of error detection to be performed is dynamically determined.

The codeword, comprising all $N_2$ bits, is then transmitted over the channel so that upon reception at the receiver, there is a non-zero probability that some of the bits will be received in error. Therefore, in the receiver the received codeword is checked to determine whether it should be accepted or not. One exemplary embodiment for doing this is illustrated in the flowchart of FIG. 4. First, the $K_1$ information bits are checked using the first set of error detection check bits (step 401). If an error is detected as a result of this check ("YES" path out of decision block 403), the received information bits are rejected (step 405), for example by discarding them.

If no error was detected as a result of the first check ("NO" path out of decision block 403) and a higher degree of reliability is not desired ("NO" path out of decision block 407), then the information bits may simply be accepted (step 413).

However, if no error was detected as a result of the first check ("NO" path out of decision block 403) and a higher degree of reliability is desired ("YES" path out of decision block 407), then the $K_1$ information bits along with the $L_1$ bits of the first set of error detection check bits (i.e., all $N_1$ bits) are checked using the second set of error detection check bits (step 409). If an error is detected as a result of this second check ("YES" path out of decision block 411), the received information bits are rejected (step 405), for example by discarding them.

If no error is detected as a result of this second check ("NO" path out of decision block 411), then the received information bits may be accepted (step 413).

Figure 3C:
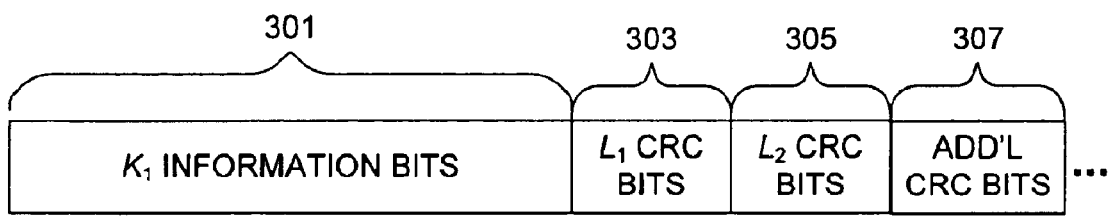

Several comments should be made with respect to the above-described embodiment. First, although a total of two sets of error detection check bits were used in the exemplary embodiment, the actual number of sets used in any particular embodiment is completely arbitrary, although in practice it is unlikely that more than two sets of error detection check bits would be necessary. Nonetheless, those of ordinary skill will recognize that those aspects related to determining the degree of desired reliability, and using a still higher level set of error detection check bits as illustrated by 307 of FIG. 3C (e.g., a third set of error detection check bits, a fourth set of error detection check bits, and so on) to check earlier bits (including not only the information bits 301 but also the bits associated with lower levels of error detection coding) could be added to the technique, as desired.

It will also be recognized that, in some embodiments employing two or more degrees of reliability, one of the choices in determining the degree of desired reliability might include not performing any error detection check at all.

Also, the step of actively determining whether greater reliability is desired (i.e., step 407) may or may not be practiced in any particular embodiment. For example, in one embodiment the second set of error detection check bits 305 may be added to enhance the error detection capability of an existing system that already has defined the first set of error detection check bits 303. Newer units can be built to always use this greater level of error detection (i.e., to use both the first and second sets of error detection check bits 303, 305), so there is no need for them to perform a step, such as decision block 407, to determine whether to continue checking past the first set of error detection check bits 303. They simply do a first error detection check, and if no error is detected, they proceed directly to performance of the second, and possibly additional, error detection checks. Since the first $N_1$ bits are not affected by adding the second set of error detection check bits 305, the addition of the second set of error detection check bits 305 is backwards compatible—older devices not having the enhanced error detection capability can simply disregard the last $L_2$ bits that constitute the second set of error detection check bits 305, and rely solely on the first set of error detection check bits 303.

In alternative embodiments, units in the system may be capable of making use of all of the sets of error detection check bits defined in the system, but the receiver may nonetheless be free to determine (e.g., via a step such as decision block 407) whether or not to actually make use of all of them. For example, a unit may be employed in a system having first and second sets of error detection check bits 303, 305, and in which the data is only valid for a limited period of time, thus only allowing for a limited number of retransmissions. If, for example, only one retransmission is allowed, the following approach might be taken. If no retransmission has yet been performed for a received packet, then the packet is accepted only if it successfully passes both the first and second error detection checks, otherwise a retransmission is requested. However, in case the received packet is the result of a retransmission, the receiver will either have to disregard the packet completely or accept it as it is, because no further retransmissions are allowed. In this situation, the receiver can be designed to rely only on the first set of error detection check bits 303, and to disregard the second set of error detection check bits 305. In this case, the decision block 407 becomes a test to determine whether this is the first time that this particular packet has been received—if YES, then continue by checking the second set of error detection check bits, otherwise ignore it and accept the packet so long as it passed the first error detection check.

In other alternatives, it may be more advantageous to base the level of error detection on how many times a particular codeword has been retransmitted. For example, the level of error detection checking performed may be gradually decreased the more times the same codeword has had to be retransmitted. In this case, the decision block 407 becomes a test to compare the number of times the codeword was retransmitted with one or more predetermined thresholds, and performing a corresponding level of error detection checking.

Figure 3D:
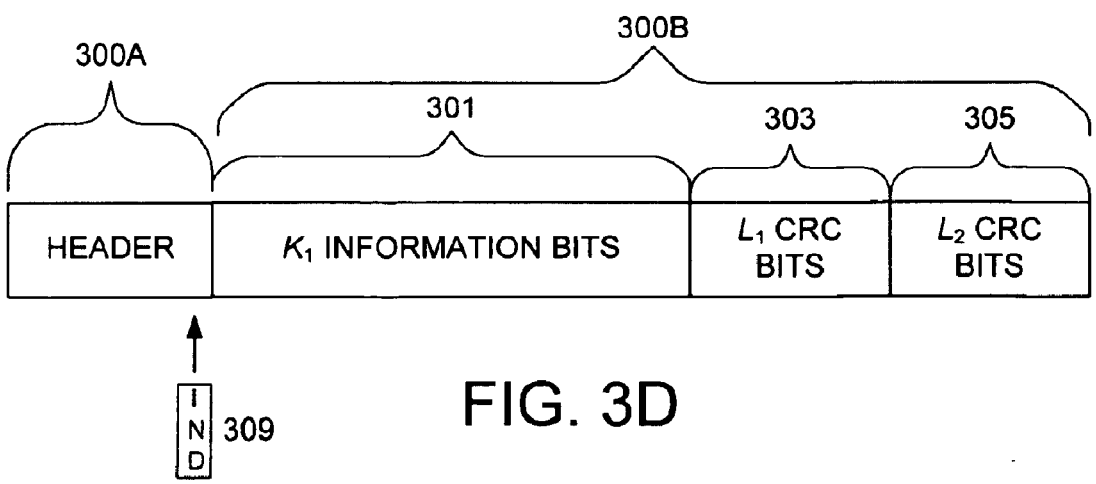

In yet another alternative embodiment, the decision block 407 that determines whether greater reliability is required is employed in a different way. In this embodiment, illustrated by FIG. 3D, an indication 309 of to what degree the payload is encoded is communicated from the transmitting side to the receiver. This indication may be included within the received codeword itself. In alternative embodiments also illustrated by FIG. 3D, the data is transmitted in packets that comprise a header 300A and a payload 300B. In the header 300A, it is indicated 309 to what degree the payload is encoded. In either of these ways, the transmitter side can adapt the degree of error detection to match the application, thus avoiding the transmission of an unnecessary amount of error detection code bits. This ability can be useful, for example, where an application, running at a higher layer of the communications protocol between transmitter and receiver, is to have the capability of configuring the lower layers to utilize an appropriate (for the particular application) level of error detection capability.

The invention has been described with reference to a particular embodiment. However, it will be readily apparent to those skilled in the art that it is possible to embody the invention in specific forms other than those of the preferred embodiment described above. This may be done without departing from the spirit of the invention.

Figure 5:
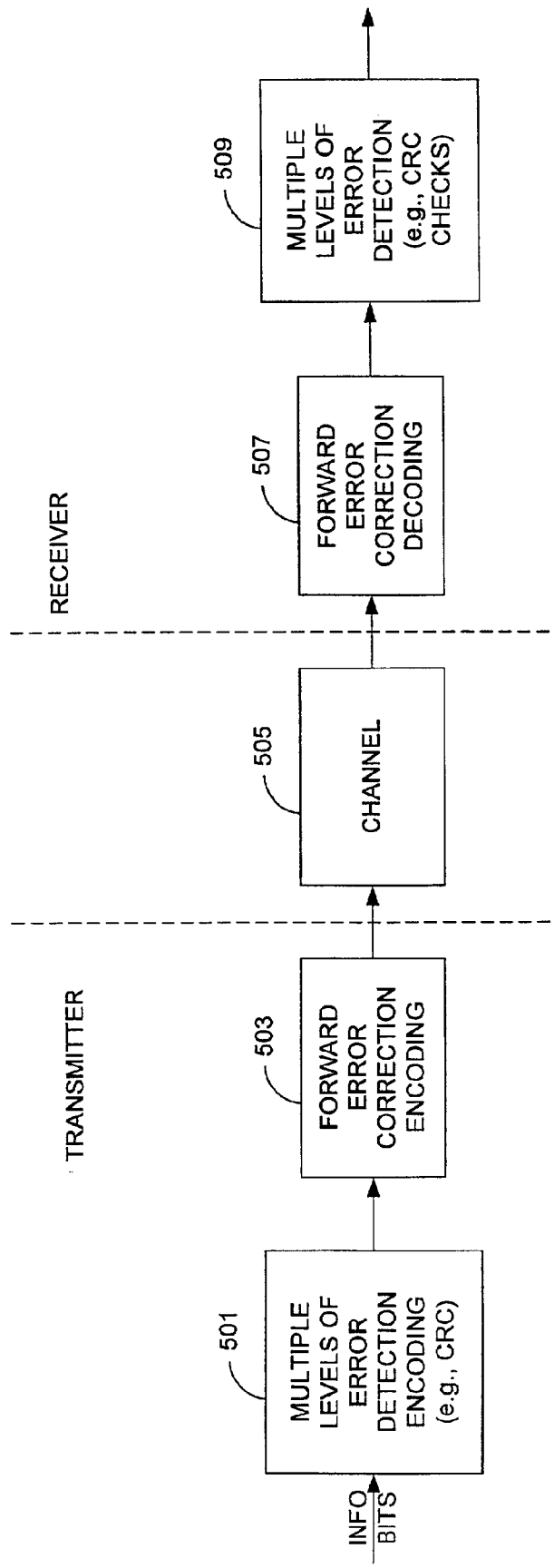
FIG. 5 is a block diagram of yet another embodiment of the invention, in which a multi-level error detection strategy is combined with the use of error correction capability.

For example, the various embodiments have discussed only the use of error detection codes. However, as mentioned earlier, any of these embodiments can be practiced in conjunction with the additional use of an error correction step, as shown in FIG. 5. First, on the transmitter side, the information bits to be sent are encoded for error detection 501, using multiple (i.e., two or more) levels of error detection as described above. Then, the information bits and the sets of error detection check bits are encoded for forward error correction 503. The resultant bits are then transmitted over the channel 505.

On the receiver side of the system, the process is the reverse. First, the received bits are subjected to error correction decoding 507. This step attempts to correct bit errors that appeared in the received group of bits. Ideally, the error correction code is able to correct most of the errors in the received blocks, and in this case the use of the FEC code permits the number of retransmissions to be reduced significantly. Before the decoded codeword is accepted as correct, however, it is checked by means of the error detection processing 509 that utilizes one or more of the multiple levels of error detection coding that was received. This will help ensure that the decoded codeword does not contain any uncorrectable errors. In this way, the probability of accepting an erroneous decoded codeword can ideally be made sufficiently small.

Thus, the preferred embodiments are merely illustrative and should not be considered restrictive in anyway. The scope of the invention is given by the appended claims, rather than the preceding description, and all variations and equivalents which fall within the range of the claims are intended to be embraced therein.

What is claimed is:

1. A method of receiving a codeword that comprises one or more information bits, a first set of error detection check bits and a second set of error detection check bits, the method comprising:

using the first set of error detection check bits to make a first determination whether the one or more information bits are error-free;

using the second set of error detection check bits to make a second determination whether the one or more information bits and the first set of error detection check bits are error-free;

accepting the one or more information bits only if the first determination indicates that the one or more information bits are error-free and the second determination indicates that the one or more information bits and the first set of error detection check bits are error-free; and determining whether a first level of error detection or a second level of error detection is to be used, wherein using the second set of error detection check bits to make the second determination whether the one or more information bits and the first set of error detection check bits are error-free, and accepting the one or more information bits only if the first determination indicates that the one or more information bits are error-free and the second determination indicates that the one or more information bits and the first set of error detection check bits are error-free are performed only if the second level of error detection is to be used.

2. The method of claim 1, further comprising:

if the first level of error detection is to be used, then accepting the one or more information bits if the first determination indicates that the one or more information bits are error-free.

3. The method of claim 1, wherein determining whether the first level of error detection or the second level of error detection is to be used comprises:

determining whether the codeword is a retransmitted codeword.

4. The method of claim 1, wherein determining whether the first level of error detection or the second level of error detection is to be used comprises:

determining how many times the codeword was retransmitted.

5. The method of claim 1, wherein:

the codeword includes an indication of how many sets of error detection check bits there are in the codeword; and determining whether the first level of error detection or the second level of error detection is to be used comprises using the indication in the codeword to determine whether the first level of error detection or the second level of error detection is to be used.

6. The method of claim 1, wherein:

the codeword was received in a packet;

the packet further includes a header;

the header includes an indication of how many sets of error detection check bits there are in the codeword; and determining whether the first level of error detection or the second level of error detection is to be used comprises using the indication in the header to determine whether the first level of error detection or the second level of error detection is to be used.

7. A method of receiving a codeword that comprises one or more information bits, a first set of error detection check bits and a second set of error detection check bits, the method comprising:

using the first set of error detection check bits to make a first determination whether the one or more information bits are error-free;

using the second set of error detection check bits to make a second determination whether the one or more information bits and the first set of error detection check bits are error-free; and accepting the one or more information bits only if the first determination indicates that the one or more information bits are error-free and the second determination indicates that the one or more information bits and the first set of error detection check bits are error-free, wherein:

the codeword was generated by means of an error correction code that was applied to the one or more information bits, the first set of error detection check bits and the second set of error detection check bits;

and the method further comprises:

decoding the codeword using the error correction code.

8. A method of receiving a codeword that comprises one or more information bits and a plurality of sets of error detection check bits, wherein each of the sets of error detection check bits is associated with a corresponding portion of the codeword, the method comprising:

determining how many error detection checks should be performed;

until the determined number of error detection checks are performed, repeatedly using a different one of the sets of error detection check bits to determine whether the corresponding portion of the received codeword contains an error; and disregarding all remaining unused different ones of the sets of error detection check bits.

9. The method of claim 8, wherein determining how many error detection checks should be performed comprises determining whether the received codeword is a retransmitted codeword.

10. The method of claim 8, wherein determining how many error detection checks should be performed comprises determining how many times the received codeword has been retransmitted.

11. The method of claim 8, wherein:

the codeword includes an indication of how many sets of error detection check bits there are in the codeword; and determining how many error detection checks should be performed comprises using the indication in the codeword to determine how many error detection checks should be performed.

12. The method of claim 8, wherein:

the codeword was received in a packet;

the packet further includes a header;

the header includes an indication of how many sets of error detection check bits there are in the codeword; and determining how many error detection checks should be performed comprises using the indication in the header to determine how many error detection checks should be performed.

13. An apparatus for receiving a codeword that comprises one or more information bits, a first set of error detection check bits and a second set of error detection check bits, the apparatus comprising:

logic that uses the first set of error detection check bits to make a first determination whether the one or more information bits are error-free;

logic that uses the second set of error detection check bits to make a second determination whether the one or more information bits and the first set of error detection check bits are error-free;

logic that accepts the one or more information bits only if the first determination indicates that the one or more information bits are error-free and the second determination indicates that the one or more information bits and the first set of error detection check bits are error-free; and logic that determines whether a first level of error detection or a second level of error detection is to be used, wherein the logic that uses the second set of error detection check bits to make the second determination whether the one or more information bits and the first set of error detection check bits are error-free, and the logic that accepts the one or more information bits only if the first determination indicates that the one or more information bits are error-free and the second determination indicates that the one or more information bits and the first set of error detection check bits are error-free operate only if the second level of error detection is to be used.

14. The apparatus of claim 13, further comprising:

logic that responds to a determination that the first level of error detection is to be used by accepting the one or more information bits if the first determination indicates that the one or more information bits are error-free.

15. The apparatus of claim 13, wherein the logic that determines whether the first level of error detection or the second level of error detection is to be used comprises:

logic that determines whether the codeword is a retransmitted codeword.

16. The method of claim 13, wherein the logic that determines whether the first level of error detection or the second level of error detection is to be used comprises:

logic that determines how many times the codeword was retransmitted.

17. The apparatus of claim 13, wherein:

the codeword includes an indication of how many sets of error detection check bits there are in the codeword; and the logic that determines whether the first level of error detection or the second level of error detection is to be used comprises logic that uses the indication in the codeword to determine whether the first level of error detection or the second level of error detection is to be used.

18. The apparatus of claim 13, wherein:

the codeword was received in a packet;

the packet further includes a header;

the header includes an indication of how many sets of error detection check bits there are in the codeword; and the logic that determines whether the first level of error detection or the second level of error detection is to be used comprises logic that uses the indication in the header to determine whether the first level of error detection or the second level of error detection is to be used.

19. An apparatus for receiving a codeword that comprises one or more information bits, a first set of error detection check bits and a second set of error detection check bits, the apparatus comprising:

logic that uses the first set of error detection check bits to make a first determination whether the one or more information bits are error-free;

logic that uses the second set of error detection check bits to make a second determination whether the one or more information bits and the first set of error detection check bits are error-free;

logic that accepts the one or more information bits only if the first determination indicates that the one or more information bits are error-free and the second determination indicates that the one or more information bits and the first set of error detection check bits are error-free; and wherein:

the codeword was generated by means of an error correction code that was applied to the one or more information bits, the first set of error detection check bits and the second set of error detection check bits;

and the apparatus further comprises:

logic that decodes the codeword using the error correction code.

20. An apparatus for receiving a codeword that comprises one or more information bits and a plurality of sets of error detection check bits, wherein each of the sets of error detection check bits is associated with a corresponding portion of the codeword, the apparatus comprising:

logic that determines how many error detection checks should be performed; and error detection logic that operates until the determined number of error detection checks are performed, by repeatedly using a different one of the sets of error detection check bits to determine whether the corresponding portion of the received codeword contains an error, wherein the error detection logic disregards all remaining unused different ones of the sets of error detection check bits.

21. The apparatus of claim 20, wherein the logic that determines how many error detection checks should be performed comprises logic that determines whether the received codeword is a retransmitted codeword.

22. The apparatus of claim 20, wherein the logic that determines how many error detection checks should be performed comprises logic that determines how many times the received codeword has been retransmitted.

23. The apparatus of claim 20, wherein:

the codeword includes an indication of how many sets of error detection check bits there are in the codeword; and the logic that determines how many error detection checks should be performed comprises logic that uses the indication in the codeword to determine how many error detection checks should be performed.

24. The apparatus of claim 20, wherein:

the codeword was received in a packet;

the packet further includes a header;

the header includes an indication of how many sets of error detection check bits there are in the codeword; and the logic that determines how many error detection checks should be performed comprises logic that uses the indication in the header to determine how many error detection checks should be performed.

* * * * *